United States Patent
Ambardekar et al.

(10) Patent No.: US 11,205,118 B2
(45) Date of Patent: Dec. 21, 2021

(54) POWER-EFFICIENT DEEP NEURAL NETWORK MODULE CONFIGURED FOR PARALLEL KERNEL AND PARALLEL INPUT PROCESSING

(71) Applicant: Microsoft Technology Licensing, LLC, Redmond, WA (US)

(72) Inventors: Amol Ashok Ambardekar, Redmond, WA (US); Chad Balling McBRIDE, North Bend, WA (US); George Petre, Redmond, WA (US); Larry Marvin Wall, Seattle, WA (US); Kent D. Cedola, Bellevue, WA (US); Boris Bobrov, Kirkland, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 921 days.

(21) Appl. No.: 15/951,690

(22) Filed: Apr. 12, 2018

(65) Prior Publication Data

US 2018/0300615 A1 Oct. 18, 2018

Related U.S. Application Data

(60) Provisional application No. 62/486,432, filed on Apr. 17, 2017.

(51) Int. Cl.
*G06F 7/02* (2006.01)
*G06N 3/063* (2006.01)
(Continued)

(52) U.S. Cl.
CPC ............. *G06N 3/063* (2013.01); *G06F 1/324* (2013.01); *G06F 1/3275* (2013.01);
(Continued)

(58) Field of Classification Search
CPC ....... G06N 3/063; G06F 1/324; G06F 3/0631; G06F 3/067; G06F 9/30087;
(Continued)

(56) References Cited

U.S. PATENT DOCUMENTS

| 4,298,954 A | 11/1981 | Bigelow et al. |
| 5,091,864 A | 2/1992 | Baji et al. |

(Continued)

FOREIGN PATENT DOCUMENTS

| EP | 0147857 A2 | 7/1985 |
| EP | 2945290 A2 | 11/2015 |

(Continued)

OTHER PUBLICATIONS

"Non Final Office Action Issued In U.S. Appl. No. 15/702,311", dated Jun. 29, 2018, 10 Pages.

(Continued)

*Primary Examiner* — Cheng Yuan Tseng
(74) *Attorney, Agent, or Firm* — Newport IP, LLC; Leonard J. Hope

(57) ABSTRACT

A deep neural network (DNN) module utilizes parallel kernel and parallel input processing to decrease bandwidth utilization, reduce power consumption, improve neuron multiplier stability, and provide other technical benefits. Parallel kernel processing enables the DNN module to load input data only once for processing by multiple kernels. Parallel input processing enables the DNN module to load kernel data only once for processing with multiple input data. The DNN module can implement other power-saving techniques like clock-gating (i.e. removing the clock from) and power-gating (i.e. removing the power from) banks of accumulators based upon usage of the accumulators. For example, individual banks of accumulators can be power-gated when all accumulators in a bank are not in use, and do (Continued)

not store data for a future calculation. Banks of accumulators can also be clock-gated when all accumulators in a bank are not in use, but store data for a future calculation.

10 Claims, 13 Drawing Sheets

(51) Int. Cl.
| | |
|---|---|
| *G06N 3/04* | (2006.01) |
| *G06F 12/0862* | (2016.01) |
| *G06F 9/46* | (2006.01) |
| *G06F 1/324* | (2019.01) |
| *G06F 3/06* | (2006.01) |
| *G06F 9/38* | (2018.01) |
| *G06F 12/08* | (2016.01) |
| *G06F 12/10* | (2016.01) |
| *G06F 15/80* | (2006.01) |
| *G06F 17/15* | (2006.01) |
| *G06N 3/06* | (2006.01) |
| *G06N 3/08* | (2006.01) |
| *G06N 3/10* | (2006.01) |
| *H03M 7/30* | (2006.01) |
| *H04L 12/715* | (2013.01) |
| *H04L 29/08* | (2006.01) |
| *G06F 9/30* | (2018.01) |
| *G06F 13/16* | (2006.01) |
| *G06F 1/3234* | (2019.01) |
| *G06F 12/02* | (2006.01) |
| *G06F 13/28* | (2006.01) |
| *H03M 7/46* | (2006.01) |
| *H04L 12/723* | (2013.01) |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(58) Field of Classification Search
CPC ........ G06F 9/3836; G06F 9/3887; G06F 9/46; G06F 12/0207; G06F 12/08; G06F 12/0863; G06F 12/10; G06F 13/1673; G06F 13/1689; G06F 13/28; G06F 15/8007; G06F 17/15
See application file for complete search history.

(56) References Cited

U.S. PATENT DOCUMENTS

| | | |
|---|---|---|
| 5,487,153 A | 1/1996 | Hammerstrom et al. |
| 5,524,175 A | 6/1996 | Sato et al. |
| 5,644,749 A | 7/1997 | Obayashi |
| 5,859,990 A | 1/1999 | Yarch |
| 5,933,654 A | 8/1999 | Galdun et al. |
| 6,307,867 B1 | 10/2001 | Roobol et al. |
| 6,654,730 B1 | 11/2003 | Kato et al. |
| 6,785,239 B1 | 8/2004 | Tasker et al. |
| 6,990,079 B2 | 1/2006 | Vrabel |
| 7,012,893 B2 | 3/2006 | Bahadiroglu |
| 7,480,640 B1 | 1/2009 | Elad et al. |
| 7,539,608 B1 | 5/2009 | Dageville et al. |
| 7,694,084 B2 | 4/2010 | Raghavan et al. |
| 8,244,953 B1 | 8/2012 | Kumar |
| 8,442,927 B2 | 5/2013 | Chakradhar et al. |
| 8,892,488 B2 | 11/2014 | Qi et al. |
| 8,966,413 B2 | 2/2015 | Shacham et al. |
| 9,015,096 B2 | 4/2015 | Hunzinger |
| 9,143,393 B1 | 9/2015 | Bird et al. |
| 9,378,044 B1 | 6/2016 | Gaurav et al. |
| 9,851,771 B2 | 12/2017 | Cooper et al. |
| 9,990,307 B1 | 6/2018 | Patel et al. |
| 10,275,001 B2 | 4/2019 | Kam et al. |
| 10,296,292 B2 * | 5/2019 | Sadowski ............... G06F 7/729 |
| 10,528,864 B2 * | 1/2020 | Dally ....................... G06N 3/04 |
| 2002/0133648 A1 | 9/2002 | Goudie et al. |
| 2003/0065631 A1 | 4/2003 | Mcbride |
| 2003/0120799 A1 | 6/2003 | Lahav et al. |
| 2003/0200315 A1 | 10/2003 | Goldenberg et al. |
| 2004/0187135 A1 | 9/2004 | Pronovost et al. |
| 2005/0204189 A1 | 9/2005 | Akiba |
| 2005/0216616 A1 | 9/2005 | Eldar et al. |
| 2006/0047864 A1 | 3/2006 | Brokenshire et al. |
| 2007/0145151 A1 | 6/2007 | Nakamura et al. |
| 2008/0043742 A1 | 2/2008 | Pong et al. |
| 2008/0052441 A1 | 2/2008 | Freking et al. |
| 2008/0112438 A1 | 5/2008 | Ying et al. |
| 2008/0313385 A1 | 12/2008 | Vijayakumar et al. |
| 2008/0319933 A1 | 12/2008 | Moussa et al. |
| 2009/0037697 A1 | 2/2009 | Ramani et al. |
| 2009/0313195 A1 | 12/2009 | McDaid et al. |
| 2010/0180100 A1 | 7/2010 | Lu et al. |
| 2010/0257174 A1 | 10/2010 | Minuti |
| 2010/0281192 A1 | 11/2010 | Rakib et al. |
| 2011/0246722 A1 | 10/2011 | Taha et al. |
| 2012/0130928 A1 | 5/2012 | Bell et al. |
| 2012/0134449 A1 | 5/2012 | Chen et al. |
| 2014/0046882 A1 | 2/2014 | Wood |
| 2014/0181464 A1 | 6/2014 | Forsyth et al. |
| 2014/0281221 A1 | 9/2014 | Wang et al. |
| 2014/0372670 A1 | 12/2014 | Vasilyuk |
| 2015/0363239 A1 | 12/2015 | Hsu et al. |
| 2016/0098388 A1 | 4/2016 | Blevins et al. |
| 2016/0184587 A1 | 6/2016 | Heuvel et al. |
| 2016/0267377 A1 | 9/2016 | Pan et al. |
| 2016/0328644 A1 | 11/2016 | Lin et al. |
| 2016/0335119 A1 | 11/2016 | Merrill et al. |
| 2016/0350653 A1 | 12/2016 | Socher et al. |
| 2017/0011288 A1 | 1/2017 | Brothers et al. |
| 2017/0199902 A1 | 7/2017 | Mishra et al. |
| 2018/0095751 A1 * | 4/2018 | Aminot ............... G06F 9/30101 |
| 2018/0164866 A1 * | 6/2018 | Turakhia ................. G06N 3/063 |
| 2018/0225116 A1 * | 8/2018 | Henry .................. G06F 9/30076 |
| 2018/0299943 A1 | 10/2018 | Mcbride et al. |
| 2018/0300601 A1 | 10/2018 | Cedola et al. |
| 2018/0300602 A1 | 10/2018 | Petre et al. |
| 2018/0300603 A1 | 10/2018 | Ambardekar et al. |
| 2018/0300604 A1 | 10/2018 | Mcbride et al. |
| 2018/0300605 A1 | 10/2018 | Ambardekar et al. |
| 2018/0300606 A1 | 10/2018 | Corkery et al. |
| 2018/0300607 A1 | 10/2018 | Petre et al. |
| 2018/0300613 A1 | 10/2018 | Petre et al. |
| 2018/0300614 A1 | 10/2018 | Ambardekar et al. |
| 2018/0300615 A1 * | 10/2018 | Ambardekar ............ G06F 12/08 |
| 2018/0300616 A1 | 10/2018 | Ambardekar et al. |

(56) References Cited

U.S. PATENT DOCUMENTS

| | | | |
|---|---|---|---|
| 2018/0300617 A1 | 10/2018 | Mcbride et al. | |
| 2018/0300633 A1 | 10/2018 | Mcbride et al. | |
| 2018/0300634 A1 | 10/2018 | Mcbride et al. | |
| 2019/0026078 A1* | 1/2019 | Bannon | G06N 3/063 |
| 2019/0171930 A1* | 6/2019 | Lee | G06N 3/063 |
| 2020/0233820 A1 | 7/2020 | Mcbride et al. | |
| 2020/0250842 A1* | 8/2020 | Lee | G06N 3/063 |
| 2020/0336273 A1* | 10/2020 | Ovsiannikov | H03M 7/6005 |

FOREIGN PATENT DOCUMENTS

| | | | |
|---|---|---|---|
| EP | 3035204 A1 | 6/2016 | |
| EP | 3035249 A1 | 6/2016 | |
| WO | 1993014459 A1 | 7/1993 | |
| WO | 2016118257 A1 | 7/2016 | |
| WO | 2016210030 A1 | 12/2016 | |
| WO | WO-2018058452 A1 * | 4/2018 | G06N 3/063 |

OTHER PUBLICATIONS

"International Search Report and Written Opinion Issued In PCT Application No. PCT/US2018/026358", dated Jul. 11, 2018, 15 Pages.

"International Search Report and Written Opinion Issued In PCT Application No. PCT/US2018/026352", dated Jun. 27, 2018, 11 Pages.

"International Search Report and Written Opinion Issued In PCT Application No. PCT/US2018/026353", dated Jul. 6, 2018, 15 Pages.

"International Search Report and Written Opinion Issued In PCT Application No. PCT/US2018/026354", dated Jul. 31, 2018, 15 Pages.

"International Search Report and Written Opinion Issued In PCT Application No. PCT/US2018/026355", dated Jul. 9, 2018, 16 Pages.

"International Search Report and Written Opinion Issued In PCT Application No. PCT/US2018/026356", dated Jul. 6, 2018, 16 Pages.

"International Search Report and Written Opinion Issued In PCT Application No. PCT/US2018/026357", dated Jul. 9, 2018, 16 Pages.

"Non Final Office Action Issued in U.S. Appl. No. 15/702,311", dated May 21, 2019, 12 Pages.

"Notice of Allowance Issued in U.S. Appl. No. 15/694,663", dated May 8, 2020, 9 Pages.

"Final Office Action Issued in U.S. Appl. No. 15/702,311", dated Nov. 5, 2018, 12 Pages.

"International Search Report & Written Opinion Issued in PCT Patent Application No. PCT/US18/027674", dated Jul. 13, 2018, 13 Pages.

"International Search Report & Written Opinion Issued in PCT Patent Application No. PCT/US18/027680", dated Sep. 27, 2018, 13 Pages.

"International Search Report & Written Opinion Issued in PCT Patent Application No. PCT/US18/027828", dated Aug. 3, 2018, 11 Pages.

"International Search Report & Written Opinion Issued in PCT Patent Application No. PCT/US18/027834", dated Jul. 24, 2018, 11 Pages.

"International Search Report & Written Opinion Issued in PCT Patent Application No. PCT/US18/027836", dated Aug. 3, 2018, 14 Pages.

"International Search Report & Written Opinion Issued in PCT Patent Application No. PCT/US18/027837", dated Aug. 3, 2018, 10 Pages.

"International Search Report & Written Opinion Issued in PCT Patent Application No. PCT/US18/027840", dated Jul. 30, 2018, 9 Pages.

Chi, et al., "Prime: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 Pages.

"Ex Parte Quayle Action Issued in U.S. Appl. No. 15/950,644", Mailed Date: Sep. 23, 2019, 7 Pages.

"Notice of Allowance Issued in U.S. Appl. No. 15/702,311", dated Sep. 11, 2019, 6 Pages.

* cited by examiner

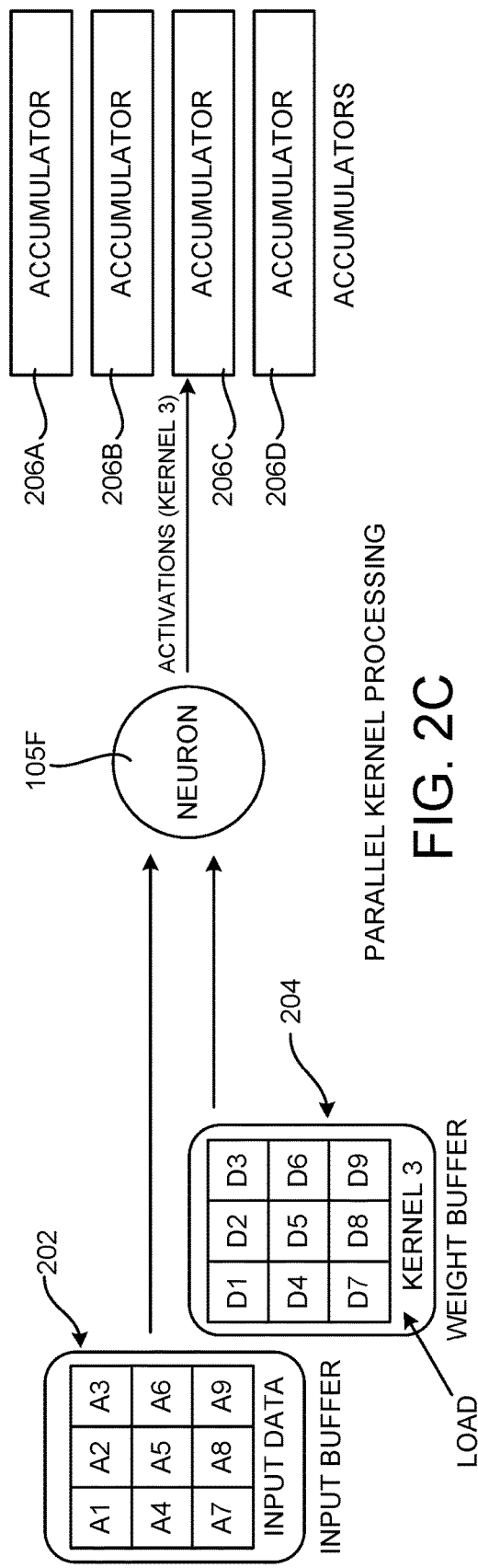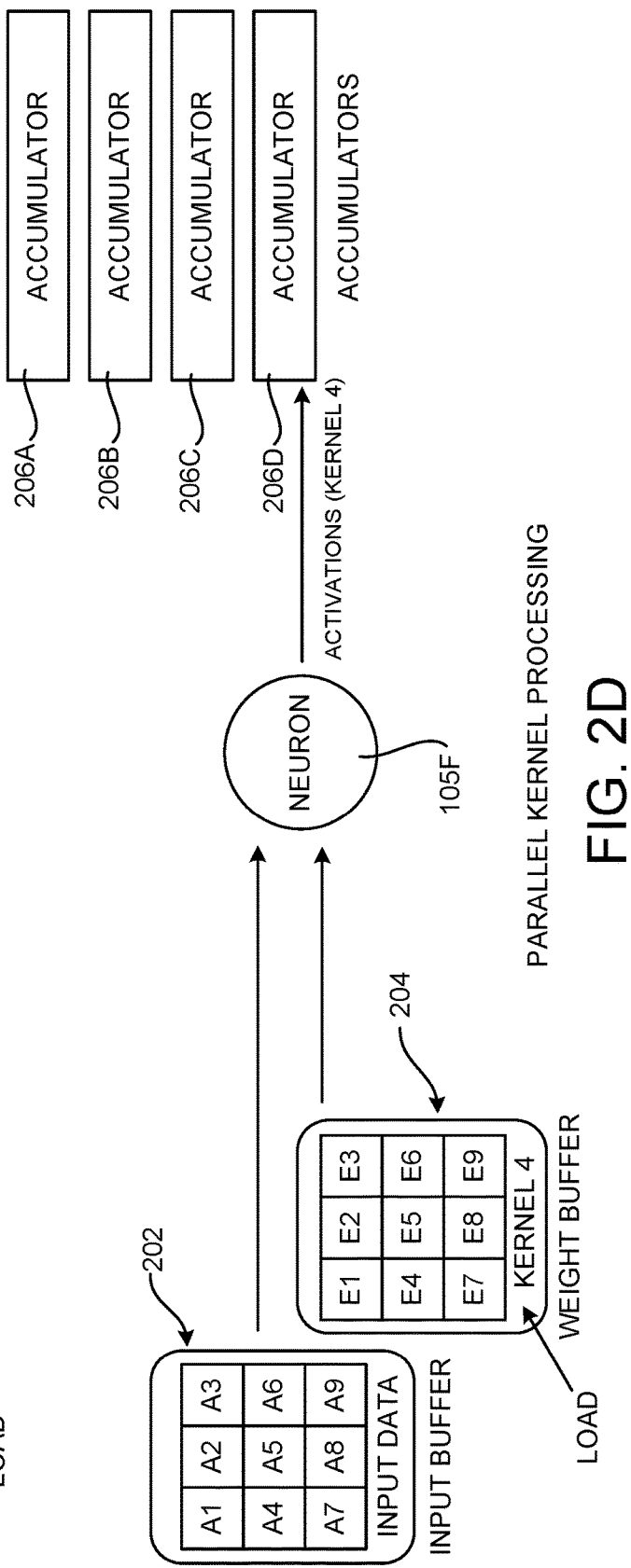
FIG. 2C
FIG. 2D

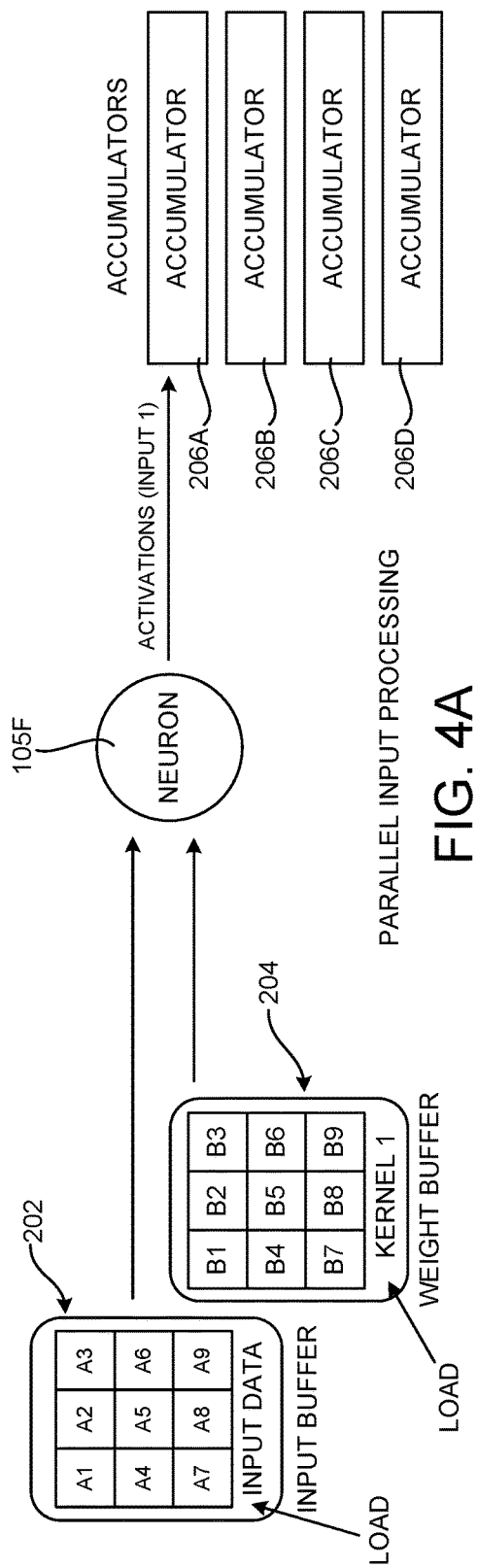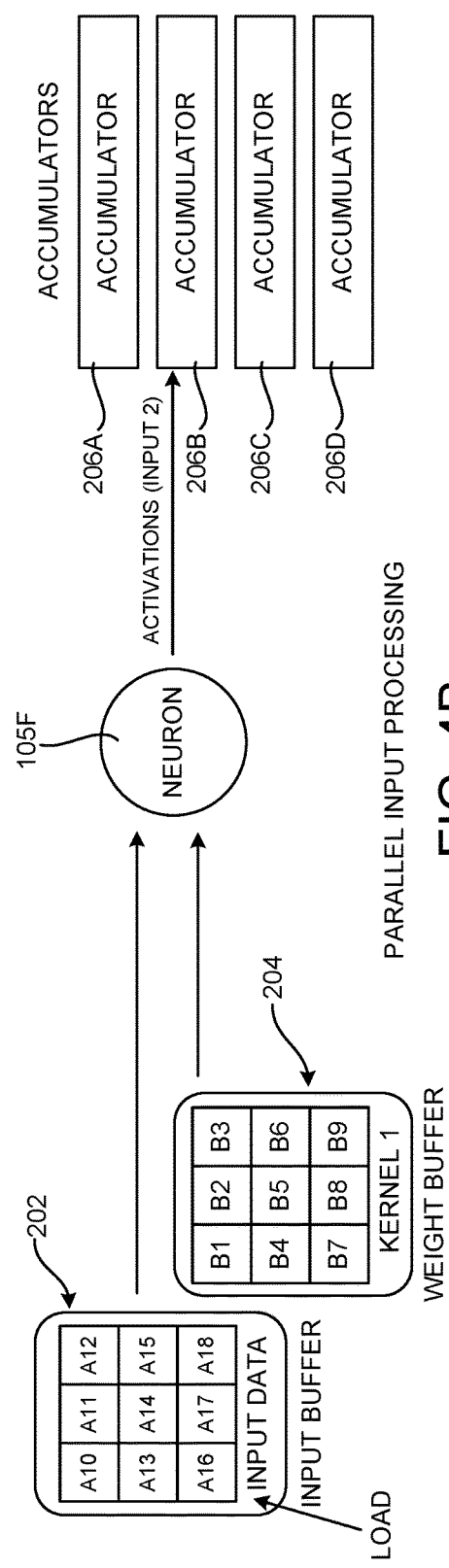

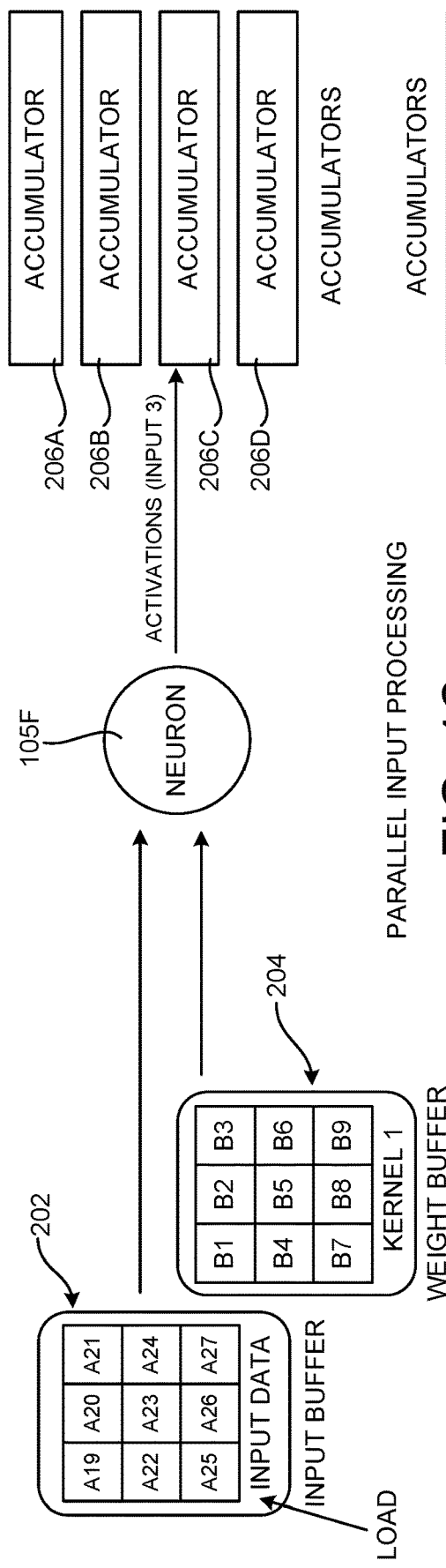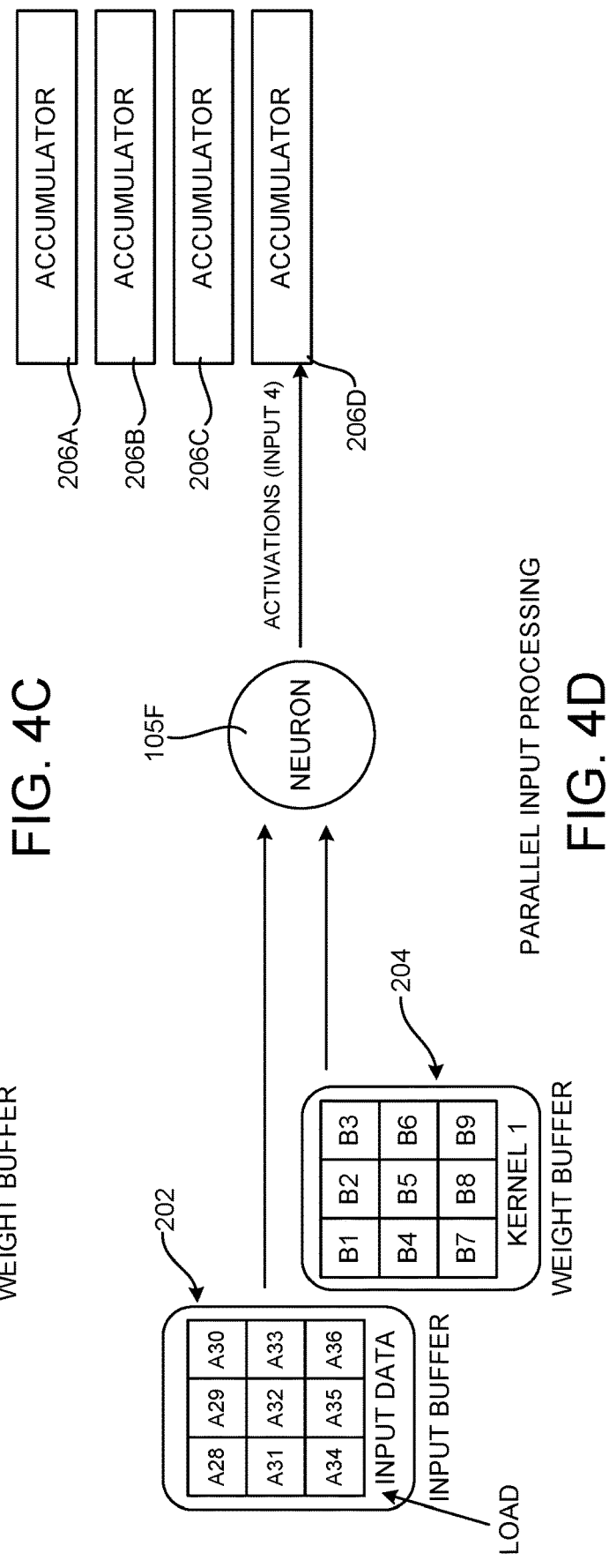

POWER-EFFICIENT DEEP NEURAL NETWORK MODULE CONFIGURED FOR PARALLEL KERNEL AND PARALLEL INPUT PROCESSING

CROSS-REFERENCE TO RELATED APPLICATIONS

This application claims priority under 35 U.S.C. § 119(e) to U.S. Provisional Patent Application No. 62/486,432, filed on Apr. 17, 2017 and titled "Enhanced Neural Network Designs," the entire disclosure of which is expressly incorporated in its entirety by reference herein.

BACKGROUND

Deep neural networks ("DNNs") are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be important in non-battery-powered devices, such as a power-over-Ethernet ("POE") security camera for example. In this specific example, POE switches can provide only a limited amount of power, and reducing the power consumption of POE devices like security cameras permits the use of POE switches that provide less power.

Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

It is with respect to these and other technical challenges that the disclosure made herein is presented.

SUMMARY

A DNN module is disclosed herein that utilizes parallel kernel and parallel input processing to decrease bandwidth utilization, reduce power consumption, improve neuron multiplier stability, and provide other technical benefits. The DNN module can also implement other power-reduction techniques such as, but not limited to, dynamic clock-gating and power-gating of accumulator memory in the DNN module. Other technical benefits not specifically mentioned herein can also be realized through implementations of the disclosed subject matter.

In order to realize the technical benefits mentioned briefly above, a DNN module is provided that is capable of parallel kernel processing, which enables the DNN module to load input data only once for processing by multiple kernels. In this manner, multiple kernels can be processed at the same time without loading the same input again (or loading the input data fewer times). Separate accumulators are maintained to store partial sums for different kernels. The accumulators accumulate (e.g. sum) previously stored values with incoming values (e.g. the output of arithmetic operations such as the multiplication of input and weight values).

The DNN module utilizes two buffers in one embodiment: an input buffer for storing input data to the neural network; and a weight buffer for storing weight data, or kernels. Input data is loaded into the input buffer and weight data for a kernel is loaded into the weight buffer. In some configurations the contents of the buffers is then copied to a shadow buffer and presented to the neurons. A neuron can then operate on the input data and the weight data, such as by performing arithmetic operations using one or more operands (i.e. input values) from the input buffer and one or more operands from the weight buffer (i.e. weights). Results from the arithmetic operations can be accumulated by an accumulator assigned to the kernel.

When operations for the first kernel have completed, weight data for a second kernel can be loaded into the weight buffer. However, the contents of the input buffer are not modified. The neuron can then operate on the original input data and the newly loaded weight data, such as by performing arithmetic operations using one or more operands from the original input data in the input buffer and one or more second operands from the weight buffer (i.e. weights for the second kernel). Results from the arithmetic operations can be accumulated by a different accumulator assigned to the second kernel. This process can then be repeated for additional kernels. Bandwidth reduction and power savings can thereby be achieved by loading the input buffer only once for processing by multiple kernels. Additionally, the multipliers in the neurons can operate more stably because loading input data only once for multiple kernels might reduce bit-flipping.

In some embodiments, the DNN module is capable of parallel input processing, which enables the DNN module to load kernel data once for processing with multiple input data. In this manner, multiple instances of input data can be processed without loading the same kernel data again (or loading the kernel data fewer times). In this embodiment, input data is loaded into the input buffer and weight data for a kernel is loaded into the weight buffer. A neuron can then operate on the input data and the weight data. When operations on the first input data have completed, new input data can be loaded into the input buffer. However, the contents of the weight buffer are not modified.

The neuron can then operate on the original weight data and the newly loaded input data. This process can then be repeated for additional input data and kernel data. Bandwidth reduction and power savings can thereby be achieved by loading the weight buffer only once for processing with different input data. Additionally, the multipliers in the neurons can operate more stably because loading kernel data only once for multiple instances of input data might reduce bit-flipping.

In some scenarios the amount of work required to load input and weights is asymmetrical, with far more power and time required to load input or weights for a given computation. To address this technical challenge, the DNN module can dynamically select and utilize parallel kernel or parallel input processing, as appropriate, to maximize bandwidth, time, and/or power savings. In these embodiments, the most efficient loading mechanism (e.g. parallel kernel or parallel input) can be selected based upon the amount of time, bandwidth, and/or power required to load the input or weights for a given neuron computation. The loading mechanism can be dynamically selected based upon other factors or combinations of factors in other embodiments.

In some embodiments, the DNN module can implement other power-saving techniques in conjunction with, or independently from, the parallel input and parallel kernel processing described above. For example, and without limitation, the DNN module can be configured with multiple accumulators, one or more of which might be assigned to each neuron. The accumulators can be organized into groups of accumulators, referred to herein as "banks." The neurons are configured to write their output values, such as partial sums, to the accumulators.

The DNN module can also be configured to clock-gate (i.e. remove the clock from) or power gate (i.e. remove the power from) banks of accumulators based upon usage of the accumulators. For example, individual banks of accumulators can be power-gated in which all accumulators are not currently in use and do not store data needed for a future calculation, such as partial results. Individual banks of accumulators can be clock-gated in which all accumulators are not currently in use but do store data needed for a future calculation, such as partial results. The DNN module can implement other power-saving techniques in other embodiments.

As discussed briefly above, implementations of the technologies disclosed herein can reduce memory bandwidth utilization, reduce power consumption, and enable neuron multipliers to operate more stably by reducing bit-flipping. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 2A-2D are computing architecture diagrams that show aspects of the operation of the DNN module described herein for parallel kernel processing, according to one embodiment;

FIGS. 4A-4D are computing architecture diagrams that shows aspects of the operation of the DNN module described herein for parallel input processing, according to one embodiment;

DETAILED DESCRIPTION

Figure 1:
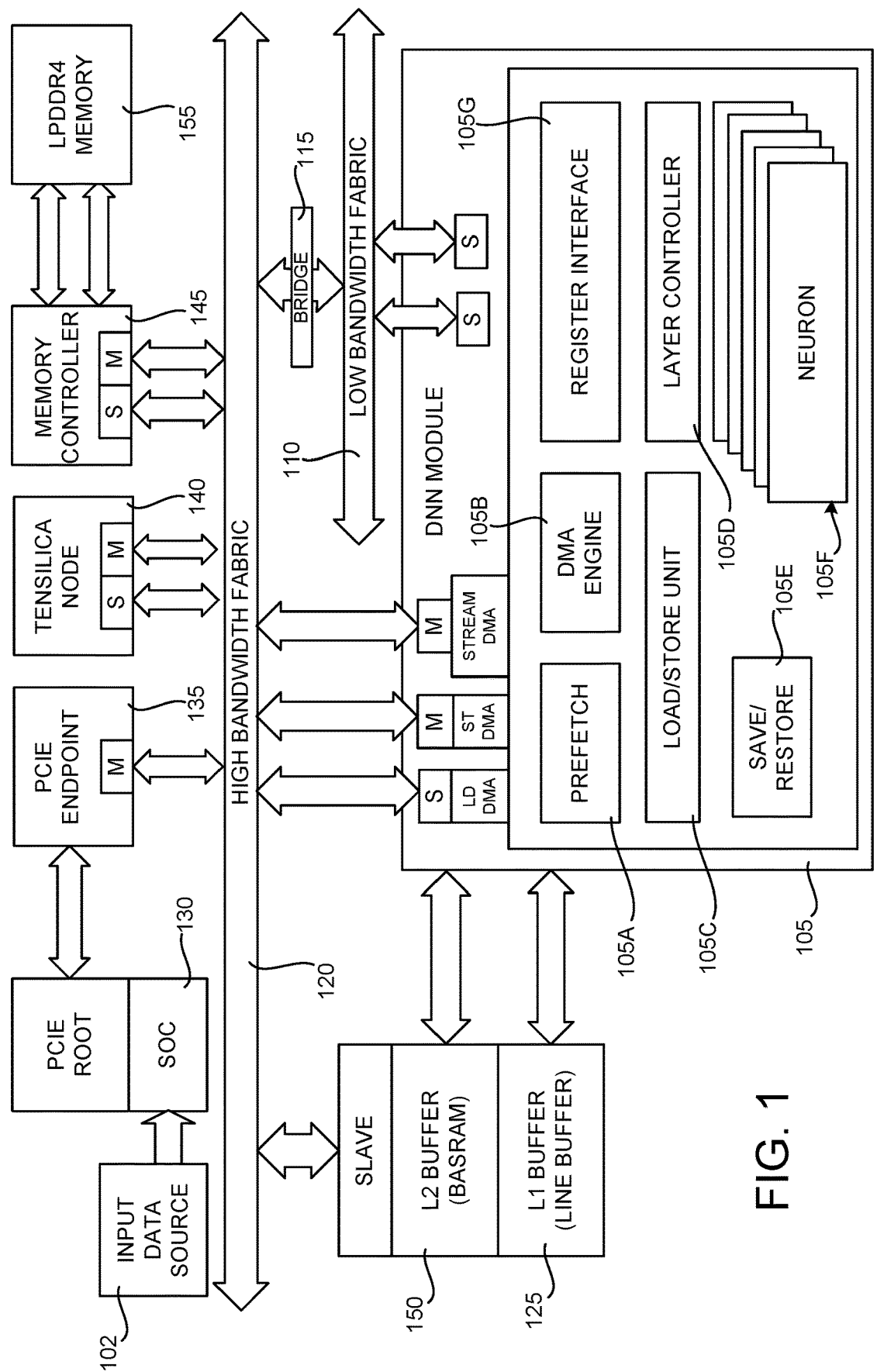
FIG. 1 is a computing architecture diagram that shows aspects of the configuration and operation of a DNN module disclosed herein, according to one embodiment.

The following detailed description is directed to a power-efficient DNN module that utilizes parallel kernel and parallel input processing. The DNN module can also utilize other power-reduction techniques such as, but not limited to, dynamic clock and power-gating of accumulator memory. As discussed briefly above, implementations of these mechanisms can decrease bandwidth utilization, reduce power consumption, and improve neuron multiplier stability. Other technical benefits not specifically mentioned herein can also be realized through implementations of the disclosed subject matter.

While the subject matter described herein is presented in the general context of a hardware DNN module, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a power-efficient DNN module that utilizes parallel kernel and parallel input processing will be described.

FIG. 1 is a computing architecture diagram that shows aspects of the configuration and operation of a deep neural network ("DNN") module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

In order to provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias, with a non-linearity applied. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F is synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1). By having multiple accumulators, the neurons 105F are able to maintain context for multiple different active kernels at a time. Each accumulator is capable of being loaded from a read of the BaSRAM 150 (described below). The accumulators can aggregate (i.e. accumulate) an incoming value with a previously present value. The accumulators can then be summed with the contents of other accumulators from other neurons 105F in some embodiments. The accumulators can be implemented using SRAM, flip-flops, registers, register files, or other suitable technologies.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an NxKxHxW set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers. In this regard, it is to be appreciated that while the techniques are described herein with reference to 3D kernels, the technologies described herein can be utilized with ND kernels.

The DNN module 105 supports three main data types: weights; input data/feature maps; and activation data, or activations. Input data/feature maps and activation data are, in most cases, two names for the same data with the distinction that when referring to an output of a layer the term activation data, or activations, is used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, step function, or another type of function. This allows the neurons 105F to train to a larger set of inputs and desired outputs where classification boundaries are non-linear.

The DNN module 105 operates on a list of layer descriptors which correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Generally, there can be two main classes of descriptors: memory-to-memory move ("M2M") descriptors; and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operational descriptors specify a specific operation that the neurons 105F should perform on a data structure located in local static random access memory ("SRAM") memory. The operational descriptors are processed in order and are capable of many different layer operations, at least some of which are described herein.

As illustrated in FIG. 1, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity with a high speed private interface operating at a selected frequency. The L1 buffer 125 can maintain a selected storage capacity that can be split between kernel and activation data. The L1 buffer 125 might be referred to herein as the "line buffer 125," and the L2 buffer 150 might be referred to herein as the BaSRAM 150.

Computational data (i.e. inputs data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise a number of other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The Host SoC 130 serves as the application processor for the DNN module 105. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described above.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

As described briefly above, the DNN module 105 can also implement various power-saving and performance-enhancing techniques. For example, and without limitation, the DNN module 105 implements parallel kernel processing in some embodiments. Details regarding parallel kernel processing are provided below with regard to FIGS. 2A-2D and 3. The DNN module can also implement parallel input processing in some embodiments, which is described below with regard to FIGS. 4A-4D and 5. The DNN module 105 can also implement other power-saving techniques like clock-gating (i.e. removing the clock from) and power-gating (i.e. removing the power from) banks of accumulators based upon usage of the accumulators. Details regarding these techniques are provided below with regard to FIGS. 6A-6D, 7, and 8.

FIGS. 2A-2D are computing architecture diagrams that show aspects of the operation of the DNN module 105 described above for parallel kernel processing, according to one embodiment. As discussed briefly above, parallel kernel processing enables the DNN module 105 to load input data only once for processing by multiple kernels. In this manner, multiple kernels can be processed at the same time without loading the same input again (or loading the input data fewer times).

To provide various aspects of the functionality disclosed herein, the DNN module 105 can utilize two buffers: an input buffer 202 for storing input data to a neural network; and a weight buffer 204 for storing weight data, or kernels. Input data is loaded into the input buffer 202 and weight data for a kernel is loaded into the weight buffer 204. The input data and weight data can be loaded from the DDR DRAM 155 or the BaSRAM 150.

Once the input and weight data have been loaded to their respective buffers, neurons 105F can operate on the input data and the weight data, such as by performing arithmetic operations using one or more operands (i.e. input values) from the input buffer 202 and one or more operands from the weight buffer 204 (i.e. weights). Results from these operations can be accumulated with previous results by an accumulator 206 assigned to the kernel. As discussed above, the accumulators 206 accumulate (e.g. sum) previously stored values with incoming values (e.g. the output of arithmetic operations such as the multiplication of input and weight values).

A single accumulator 206 or groups of accumulators 206 can be assigned to each neuron 105F. Additionally, and as illustrated in FIGS. 2A-2D, separate accumulators 206 can be maintained to accumulate partial sums for different kernels. For instance, in the example shown in FIGS. 2A-2D, the neuron 105F utilizes the accumulator 206A to accumulate partial results for one kernel, utilizes the accumulator 206B to accumulate partial results for another kernel, and so on.

To enable parallel processing of multiple kernels without reloading the input buffer 202, input data is first loaded into the input buffer 202. Weight data for a first kernel is then loaded into the weight buffer 204. The neuron 105F then performs arithmetic operations (e.g. multiplication) using operands from the input buffer 202 and the weight buffer 204. Results of these operations, which might be referred to herein as partial sums, can be accumulated by a first accumulator 206A. As mentioned above, a value previously stored in an accumulator 206 is accumulated (e.g. summed) with an incoming value from a neuron 105.

Figure 2A:
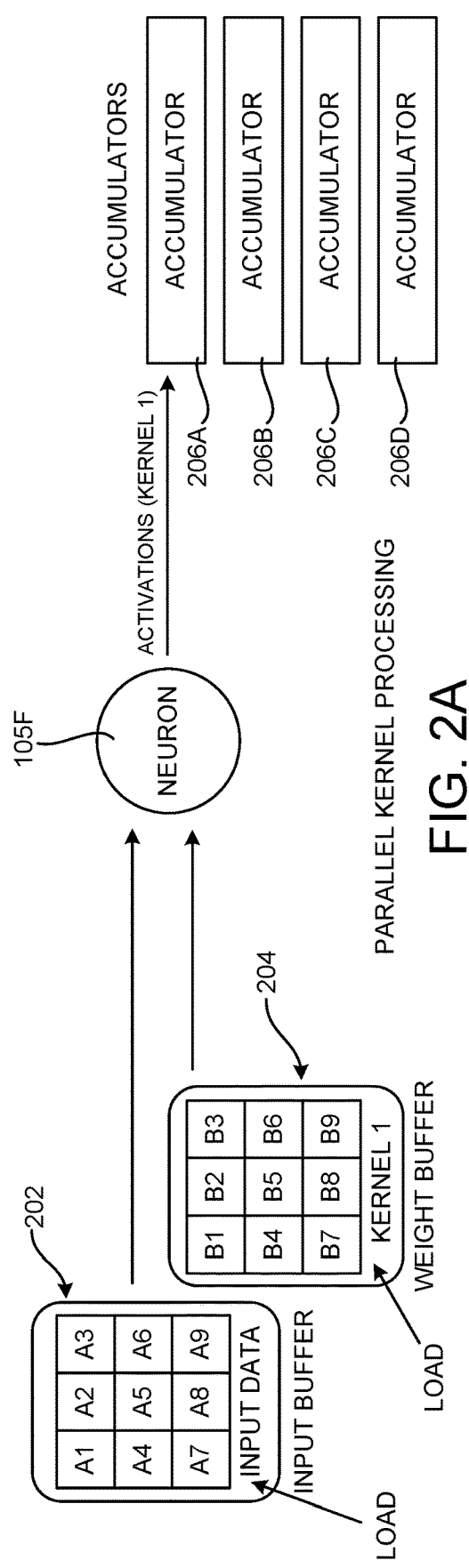
Figure 2B:
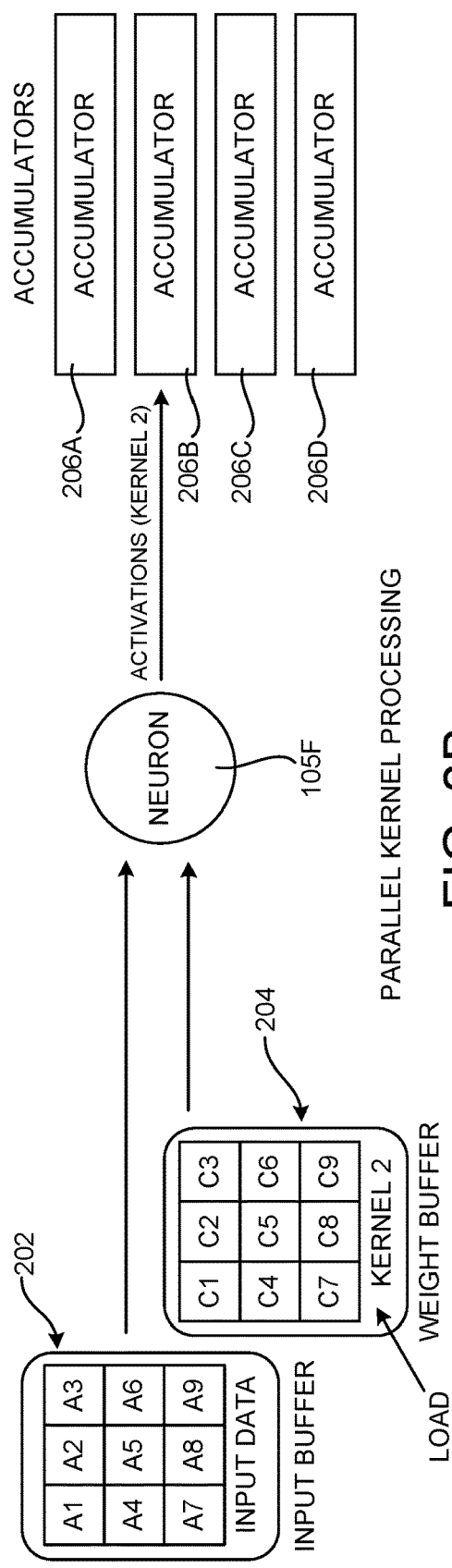

Once the kernel 105F has completed processing the data in the input buffer 202 and the weight buffer 204, weight data for another kernel is then loaded into the weight buffer 204. The input data in the input buffer 202 is not, however, updated. This is illustrated in FIG. 2B. The neuron 105F can then perform arithmetic operations using operands from the input buffer 202, which was not updated, and the updated contents of the weight buffer 204. The output of these operations can be accumulated by a second accumulator 206B by accumulating a value previously stored in the accumulator 206B with a new value generated by the neuron 105F.

This process can then continue for additional weight data. For instance, and as illustrated in FIG. 2C, weight data for a third kernel can be loaded to the weight buffer 204, without modifying the contents of the input buffer 202, and processed by the neuron 105F. Partial results for these operations can then be accumulated in the accumulator 206C by summing a previously stored value with the new value. As shown in FIG. 2D, weight data for a fourth kernel can be loaded to the weight buffer 204 and utilized by the neuron 105F. Partial results of these operations can be accumulated in the accumulator 206D by summing the previously stored value with the new value.

It is to be appreciated that, in some scenarios, only a portion of the input data might be loaded into the input buffer 202 at a time. In this case, N partial outputs exist in N accumulators 206 after the neurons 105 have processed the contents of the input buffer 202. In order to process the remainder of the data, the input buffer 202 is then loaded with the next portion of the input data and the weight buffer 204 is loaded with a corresponding set of weight values. The process described above is then repeated and the output values are aggregated using the same N accumulators 206. This process can be repeated until the entire input data set has been processed.

Once all of the input data has been processed, the accumulators 206 contain the final output values, which can be stored in the BasRAM 150 or DRAM 155. The next set of weight values can then be processed in this manner after resetting the accumulators 206 or by setting a flag indicating that the results of the first calculation should overwrite the accumulators 206 rather than accumulating.

Through an implementation of the mechanism described above with regard to FIGS. 2A-2D, bandwidth reduction and power savings can be achieved by loading the input buffer 202 only once for processing with multiple instances of weight data. Additionally, the multipliers in the neurons 105F can operate more stably because loading input data only once for multiple kernels reduces bit-flipping.

Figure 3:
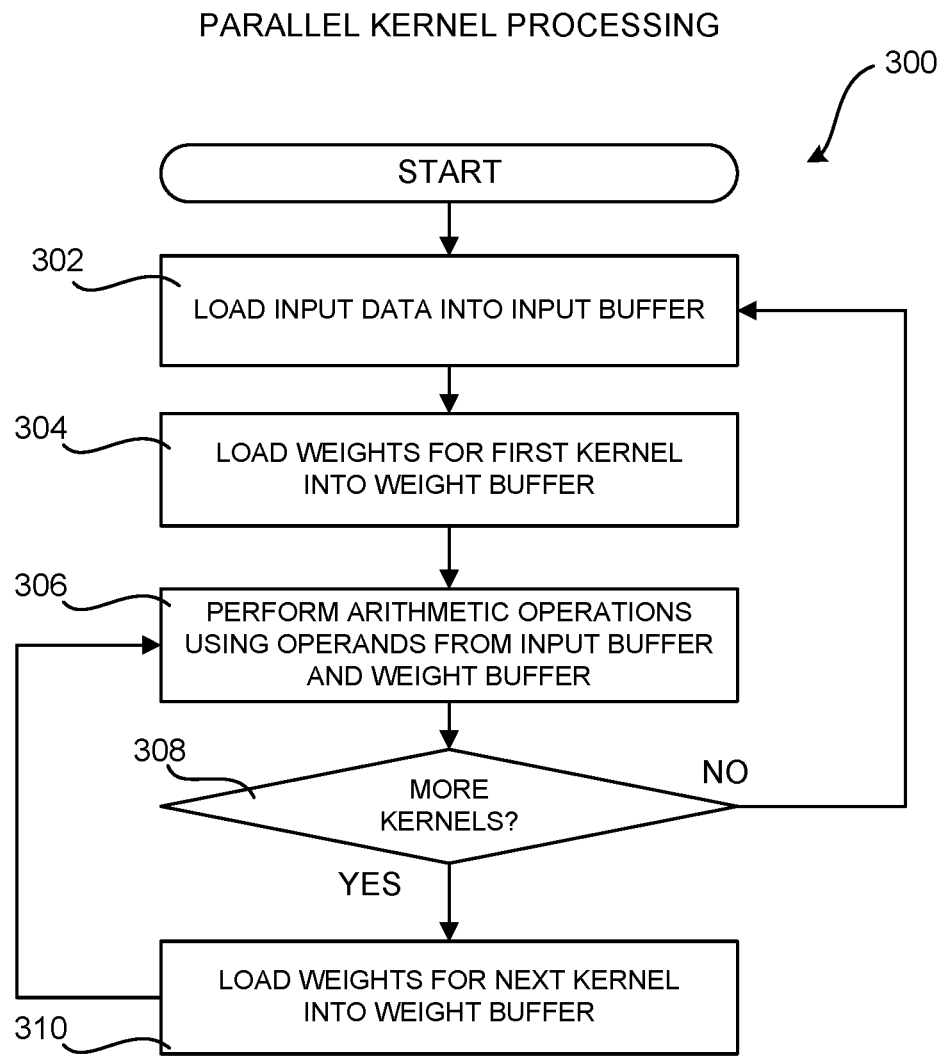
FIG. 3 is a flow diagram showing a routine that illustrates aspects of the operation of the DNN module described herein for parallel kernel processing, according to one embodiment disclosed herein.

FIG. 3 is a flow diagram showing a routine 300 that illustrates aspects of the operation of the DNN module 105 for parallel kernel processing, according to one embodiment disclosed herein. It should be appreciated that the logical operations described herein with regard to FIG. 3, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 300 begins at operation 302, where input data is loaded into the input buffer 202. The routine 300 then proceeds to operation 304, where weight data for a first kernel are loaded into the weight buffer 204. From operation 304, the routine 300 proceeds to operation 306, where a neuron 105F performs arithmetic operations using an operand from the input buffer 202 and an operand from the weight buffer 204. Partial results of the operations can be accumulated with values previously stored in an accumulator 206 assigned to the kernel being processed.

From operation 306, the routine 300 proceeds to operation 308, where the DNN module 308 determines if more kernels are to be processed with the input data currently in the input buffer 202. If so, the routine 300 proceeds from operation 308 to operation 310, where the weights for the next kernel are loaded into the weight buffer 204. As discussed above, line buffer data can be copied to a shadow buffer in some embodiments so that data can be loaded to the line buffer while neurons are processing data in the shadow buffer, thereby ensuring that the neurons do not have to wait for data to be loaded.

From operation 310, the routine 300 proceeds back to operation 306, where the neuron 105F can perform operations using the contents of the input buffer 202 and the new contents of the weight buffer 204. If additional kernels do not remain to be processed with the current input buffer 202, the routine 300 proceeds from operation 308 back to operation 302, where new input data can be loaded into the input buffer 202 and the process described above can be repeated.

FIGS. 4A-4D are computing architecture diagrams that shows aspects of the operation of the DNN module 105 for parallel input processing, according to one embodiment. As discussed briefly above, parallel input processing enables the DNN module 105 to load weight data only once for processing with multiple instances of input data. In this manner, multiple input data can be processed at the same time without loading the same kernel data again (or loading the kernel data fewer times).

As in the embodiment described above with regard to FIGS. 2A-3, input data is loaded into the input buffer 202 and weight data for a kernel is loaded into the weight buffer 204. The input data and weight data can be loaded from the DDR DRAM 155 or the BaSRAM 150.

Once the input and weight data have been loaded to their respective buffers, neurons 105F can operate on the input data and the weight data, such as by performing arithmetic operations using one or more operands (i.e. input values) from the input buffer 202 and one or more operands from the weight buffer 204 (i.e. weights). Results from these operations can be accumulated with values previously stored in an accumulator 206 assigned to the kernel.

As in the embodiment described above, a single accumulator 206 or groups of accumulators 206 can be assigned to each neuron 105F. Additionally, and as illustrated in FIGS. 4A-4D, separate accumulators 206 can be maintained to accumulate partial sums for different instances of input data. For instance, in the example shown in FIGS. 4A-4D, the neuron 105F utilizes the accumulator 206A to accumulate partial results for one instance of input data, utilizes the accumulator 206B to accumulate partial results for another instance of input data, and so on.

To enable parallel processing of multiple input without reloading the weight buffer 204, weight data is first loaded into the weight buffer 204. A first instance of input data is then loaded into the input buffer 202. The neuron 105F then performs arithmetic operations (e.g. multiplication) using operands from the input buffer 202 and the weight buffer 204. Results of these operations can be accumulated by a first accumulator 206A.

Once the kernel 105F has completed processing the data in the input buffer 202 and the weight buffer 204, another instance of input data is then loaded into the input buffer 202. The weight data in the weight buffer 204 is not, however, updated. This is illustrated in FIG. 4B. The neuron 105F can then perform arithmetic operations using operands from the weight buffer 204, which was not updated, and the updated contents of the input buffer 202. The output of these operations can be accumulated by a second accumulator 206B.

This process can then continue for additional instances of input data. For instance, and as illustrated in FIG. 4C, a third instance of input data can be loaded to the input buffer 202, without modifying the contents of the weight buffer 204, and processed by the neuron 105F. Partial results for these operations can then be accumulated by the accumulator 206C. As shown in FIG. 2D, fourth input data can be loaded to the input buffer 202 and utilized by the neuron 105F. Partial results of these operations can be accumulated by the accumulator 206D.

As in the embodiment described above, a portion of the weight data might be loaded into the weight buffer 204 at a time in some scenarios. As in the example described above, N partial outputs exist in N accumulators 206 after the neurons 105 have processed the contents of the weight buffer 204. In order to process the remainder of the weights, the weight buffer 204 is then loaded with the next portion of the weight data and the input buffer 202 is loaded with a corresponding set of input values. The process described above is then repeated and the output values are aggregated using the same N accumulators 206. This process can be repeated until the entire weight data set has been processed.

Once all of the weight data has been processed, the accumulators 206 contain the final output values, which can be stored in the BasRAM 150 or DRAM 155. The next set of weight values can then be processed in this manner after resetting the accumulators 206 or by setting a flag indicating that the results of the first calculation should overwrite the accumulators 206 rather than accumulating.

Through an implementation of the mechanism described above with regard to FIGS. 4A-4D, bandwidth reduction and power savings can be achieved by loading the weight buffer 204 only once for processing with multiple instances of input data. Additionally, the multipliers in the neurons 105F can operate more stably because loading weight data only once for multiple kernels reduces bit-flipping.

Figure 5:
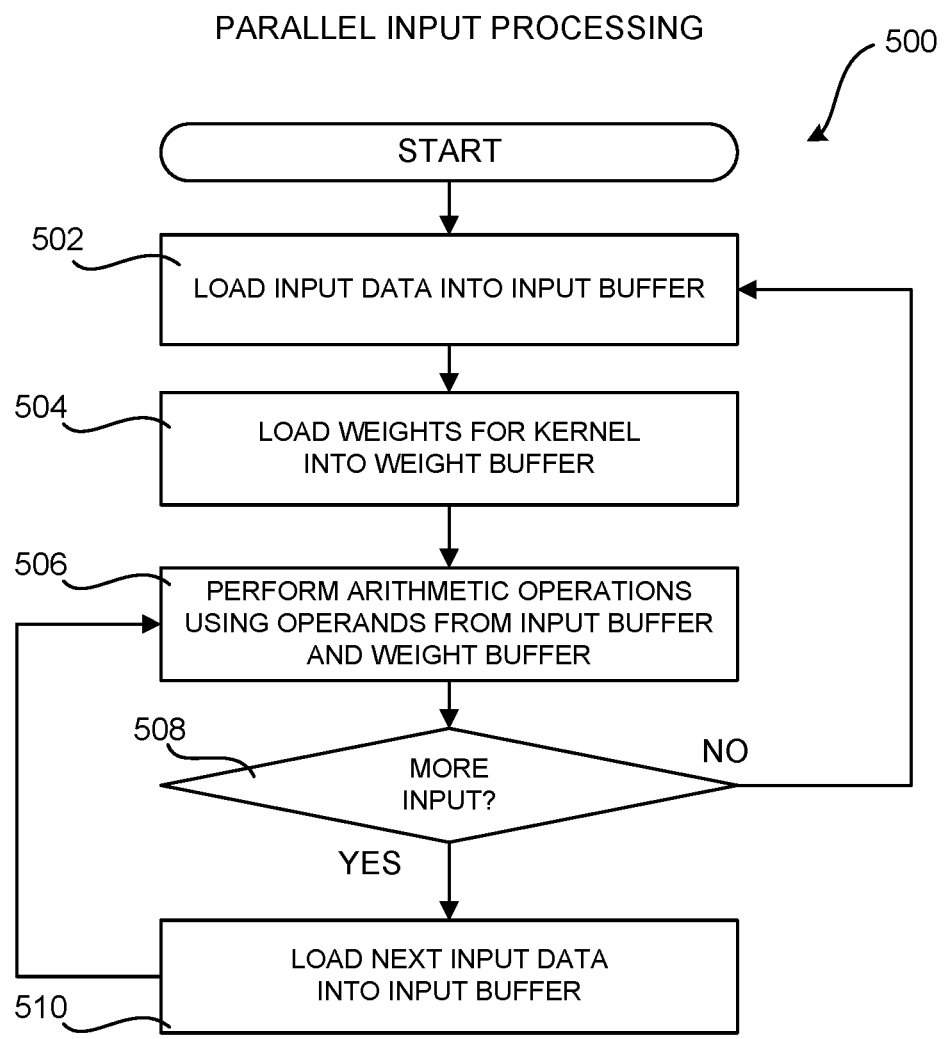
FIG. 5 is a flow diagram showing a routine that illustrates aspects of the operation of the DNN module described herein for parallel input processing, according to one embodiment disclosed herein.

FIG. 5 is a flow diagram showing a routine 500 that illustrates aspects of the operation of the DNN module 105 for parallel input processing, according to one embodiment disclosed herein. The routine 500 begins at operation 502, where input data is loaded into the input buffer 202. The routine 500 then proceeds to operation 504, where weight is loaded into the weight buffer 204. From operation 504, the routine 500 proceeds to operation 506, where a neuron 105F performs arithmetic operations using an operand from the input buffer 202 and an operand from the weight buffer 204. Partial results of these operations can be accumulated with previously stored results by an accumulator 206.

From operation 506, the routine 500 proceeds to operation 508, where the DNN module 508 determines additional instances of input data are to be processed with the weight data currently in the weight buffer 204. If so, the routine 500 proceeds from operation 508 to operation 510, where the next instance of input data is loaded into the input buffer 202. As discussed above, line buffer data can be copied to a shadow buffer in some embodiments so that data can be loaded to the line buffer while neurons are processing data in the shadow buffer, thereby ensuring that the neurons do not have to wait for data to be loaded.

From operation 510, the routine 500 proceeds back to operation 506, where the neuron 105F can perform operations using the contents of the weight buffer 204 and the new contents of the input buffer 202. If additional instances of input data do not remain to be processed with the current contents of the weight buffer 204, the routine 500 proceeds from operation 508 back to operation 502, where new input data can be loaded into the input buffer 202 and the process described above can be repeated.

FIGS. 6A-6D are computing architecture diagrams that illustrate aspects of the operation of the DNN module 105 described herein for dynamic clock and power-gating of accumulator memory, according to one embodiment. As described briefly above, in some embodiments the DNN module 105 can implement other power-saving techniques in conjunction with, or independently from, the parallel input and parallel kernel processing described above.

As discussed above, the DNN module 105 can be configured with multiple accumulators 206, one or more of which might be assigned to each neuron 105F. The accumulators 206 can be organized into groups of accumulators, referred to herein as "banks 602." The neurons 105F are configured to write their output values, such as partial sums, to the banks 602 of accumulators 206.

Figure 6B:
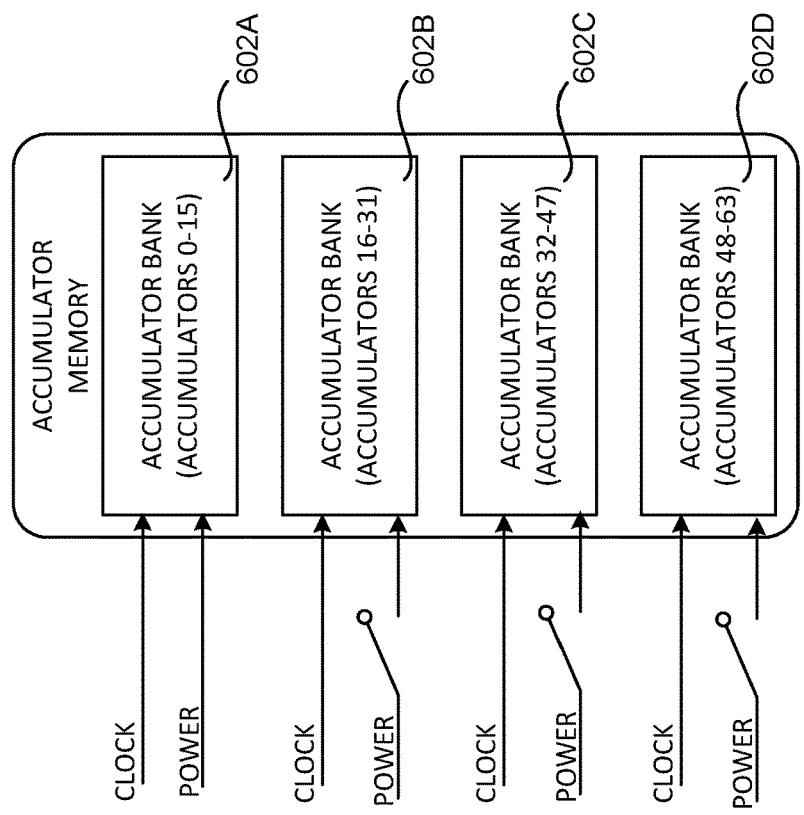
FIGS. 6A-6D are computing architecture diagrams that illustrates aspects of the operation of the DNN module described herein for dynamic clock and power-gating of accumulator memory, according to one embodiment.
Figure 6A:
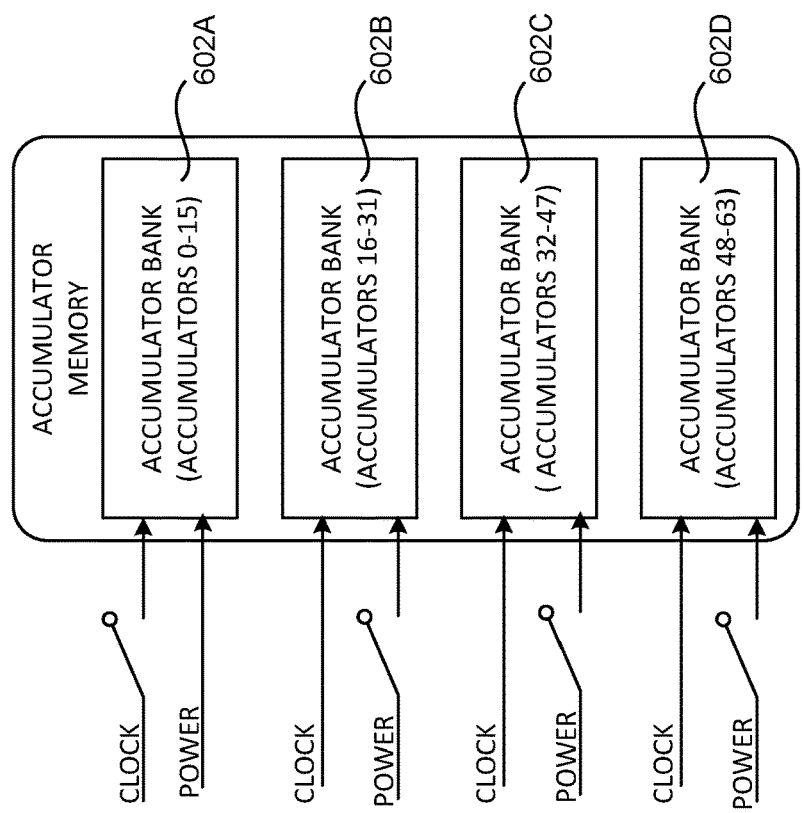

The DNN module 105 can also be configured to clock-gate (i.e. remove the clock from) or power gate (i.e. remove the power from) banks 602 of accumulators 206 based upon usage of the accumulators 206. For example, and as shown in FIG. 6A, one bank 602A of the accumulator memory can be clock-gated and the other banks 602B-602D can be power gated upon initialization. When the accumulator bank 602A is utilized, both clock and power can be applied to this bank. The other banks 602B-602C can remain to be power-gated as illustrated in FIG. 6B.

If the neurons 105F have completed use of the accumulator bank 602A, but this bank retains partial sums needed for future calculations, the accumulator bank 602A can be clock-gated, thereby retaining its contents while at the same time saving power. Both clock and power can be applied to the accumulator bank 602B, thereby enabling the neurons 105F to utilize the accumulators 206 in this bank 206B. This is illustrated in FIG. 6C.

Figure 6D:
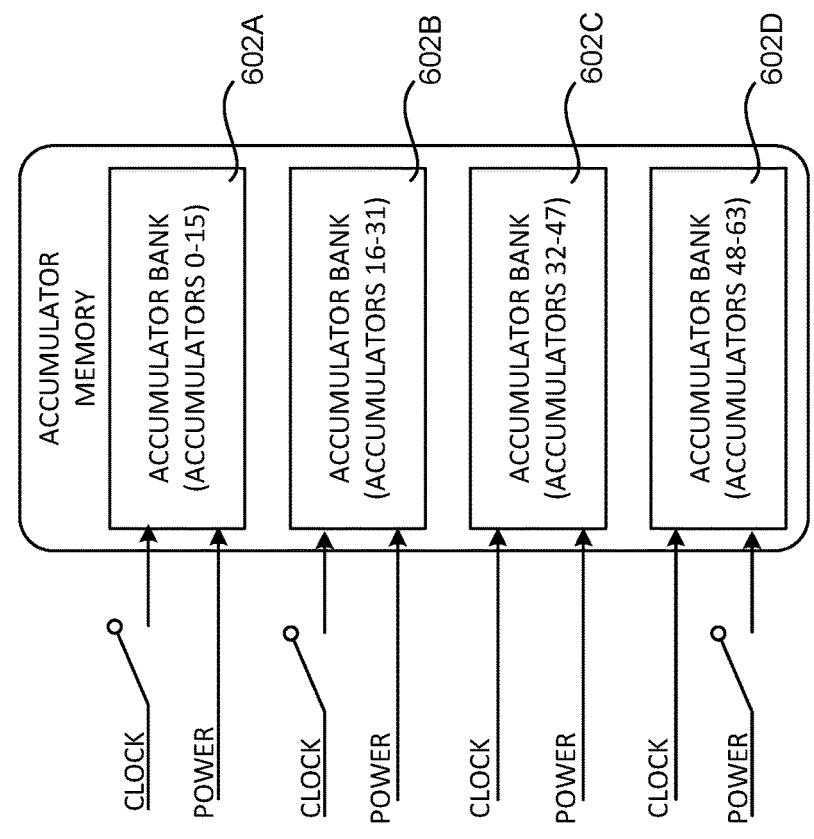
Figure 6C:
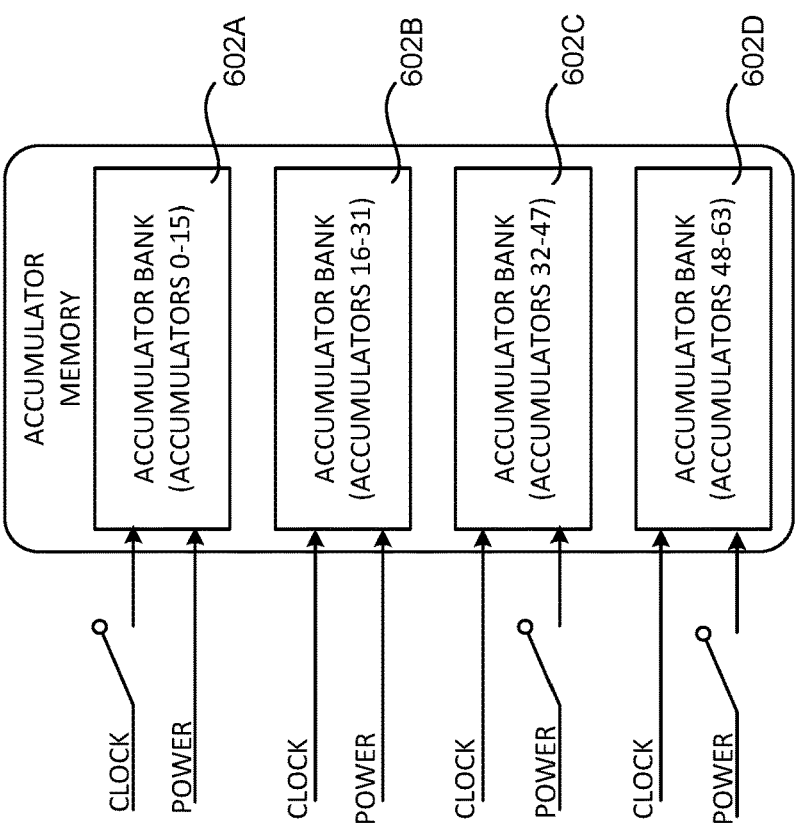

In the example shown in FIG. 6D, accumulator bank 602C is being utilized and therefore has both clock and power applied thereto, but banks 602A and 602B store partial results needed for future calculations. Accordingly, banks 602A and 602B are clock-gated, thereby saving power while retaining their contents. These banks 602A and 602B can be power-gated if they are not in use and do not store partial results needed for future calculations.

In view of the above, it is to be appreciated that the DNN module 105 can power-gate individual banks 602 of accumulators 206 if all the accumulators 206 in a bank 602 are not currently in use and do not store data needed for a future calculation, such as partial results. Likewise, individual banks 602 of accumulators 206 can be clock-gated in which all accumulators 206 are not currently in use but do store data needed for a future calculation, such as partial results. Power-gating and clock-gating can be used in combination in this manner on a per bank basis depending upon how the accumulators 206 are currently being used. Banks 602 can later be reactivated by applying both clock and power when needed by the neurons 105F. The DNN module 105 can implement other power-saving techniques in other embodiments.

Figure 7:
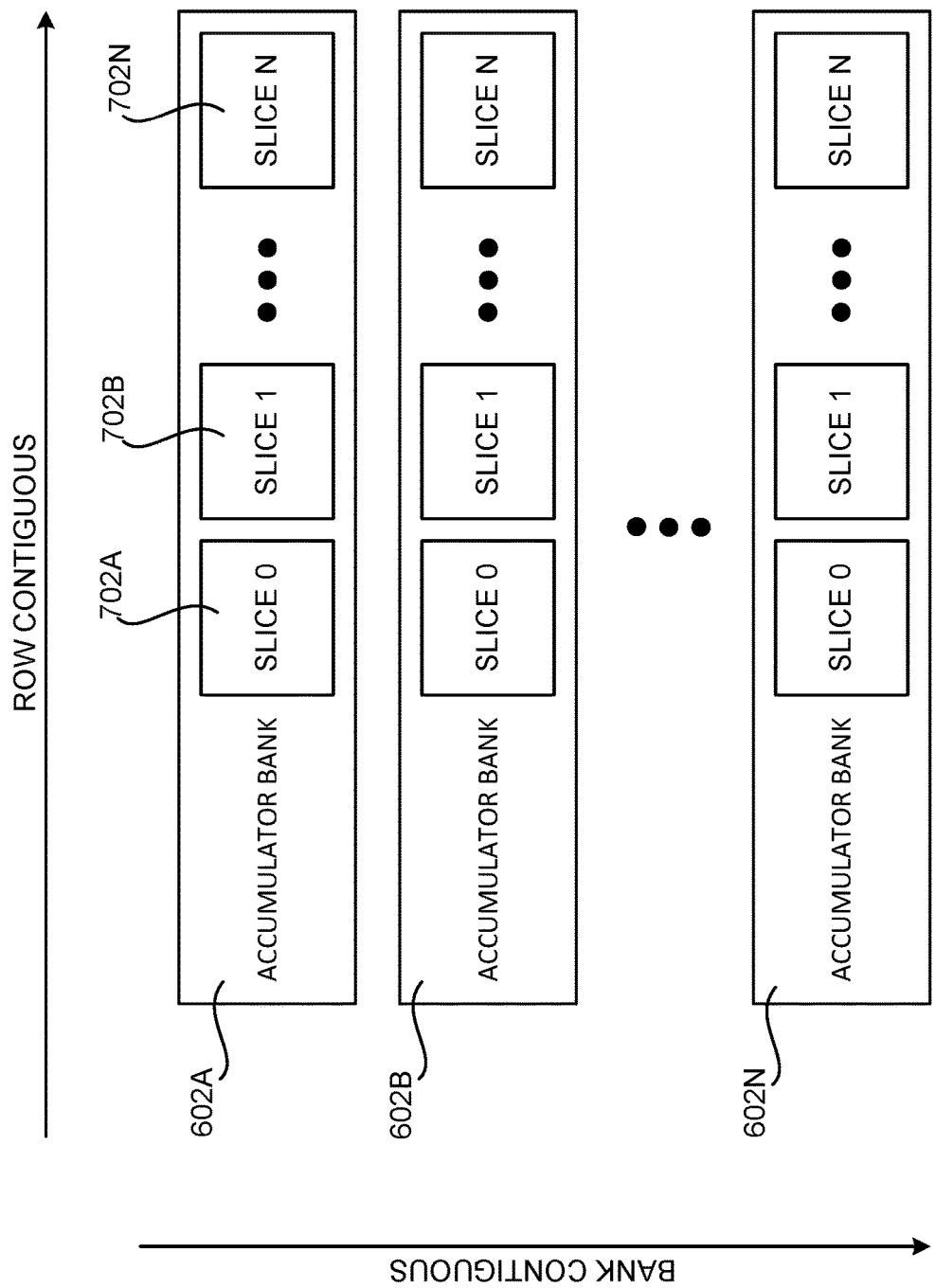
FIG. 7 is a computing architecture diagram that illustrates additional aspects of the operation of the DNN module described herein for dynamic clock and power-gating of accumulator memory, according to one embodiment.

FIG. 7 is a computing architecture diagram that illustrates additional aspects of the operation of the DNN module 105 described herein for dynamic clock and power-gating of accumulator memory, according to one embodiment. As illustrated in FIG. 7 and described above, bank continuous gating can be applied the accumulator banks 602A-602N. Additionally, however, row contiguous gating can also be utilized. In this embodiment, the accumulator banks 602A-602N can be divided into slices 702A-702N. The slices 702A-702N can also be clock-gated and power-gated in the manner described above.

Figure 8:
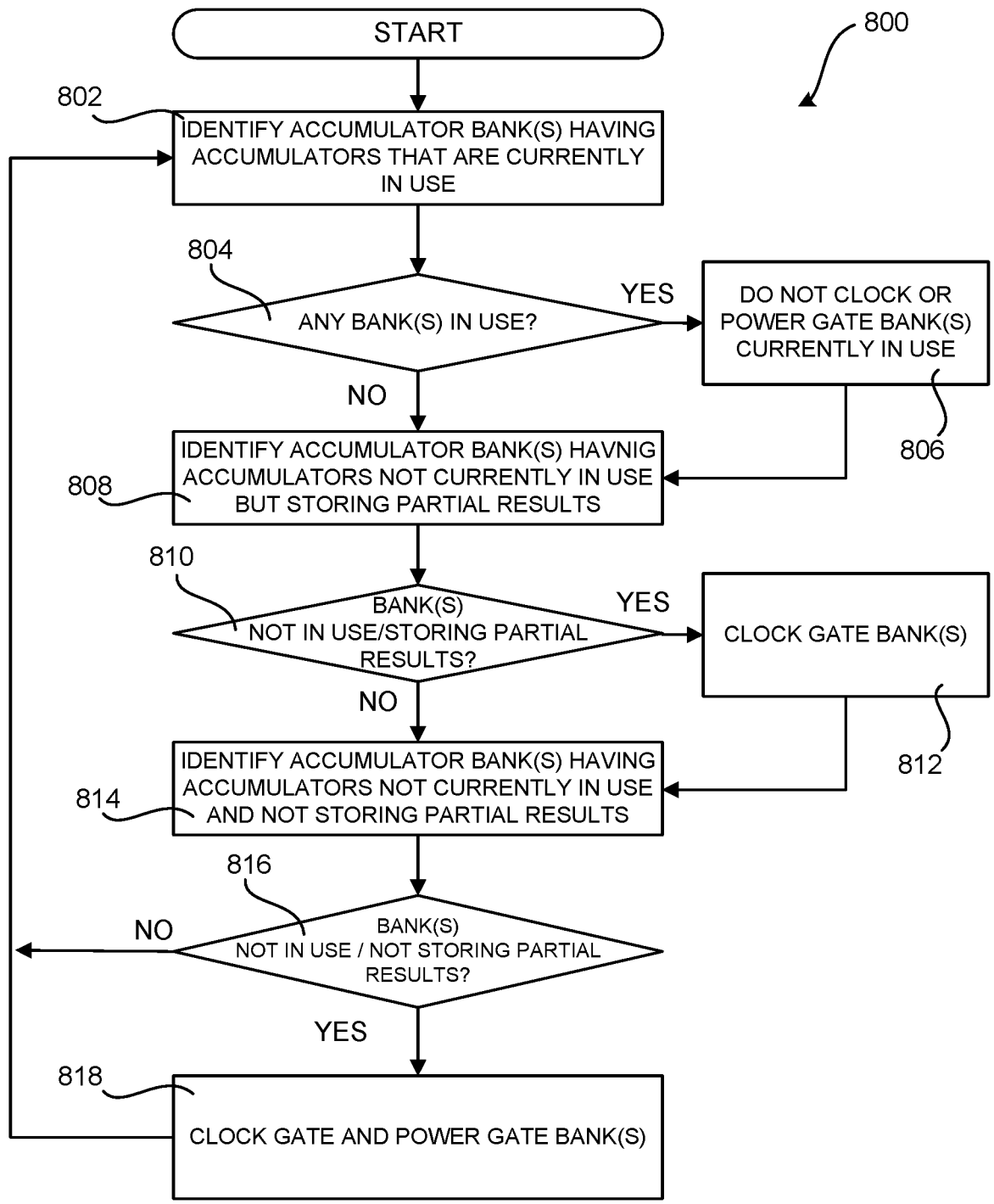
FIG. 8 is a flow diagram showing a routine that illustrates aspects of the operation of the DNN module described herein for dynamic clock and power-gating of accumulator memory, according to one embodiment disclosed herein.

FIG. 8 is a flow diagram showing a routine 800 that illustrates aspects of the operation of the DNN module 105 described herein for dynamic clock and power-gating of accumulator memory, according to one embodiment disclosed herein. The routine 800 begins at operation 802, where the DNN module 802 identifies accumulator banks 602 having accumulators 206 that are currently in use by a neuron 105F. For any banks 602 that have accumulators 206 that are currently in use, the routine 800 proceeds to operation 806, where power and clock are maintained to these banks 602 of accumulators 206.

At operation 808, the DNN module 802 identifies accumulator banks 602 where all accumulators 206 are not currently in use by a neuron 105F but where at least some of the accumulators 206 store partial results or other values needed for a future computation. The routine 800 then proceeds from operation 810 to operation 812, where these accumulator banks 602 can be clock-gated, thereby saving power while maintaining the contents of the banks 602.

At operation 814, the DNN module 802 identifies accumulator banks 602 where all of the accumulators 206 are not currently in use and do not store partial results or other values needed for a future computation. The routine 800 then proceeds to operation 818, where banks 602 where all of the accumulators 206 are not in use and do not store partial results can be both clock-gated and power-gated, thereby saving power. The routine 800 then returns from operation 818 to operation 802, where the process described above can be repeated.

Figure 9:
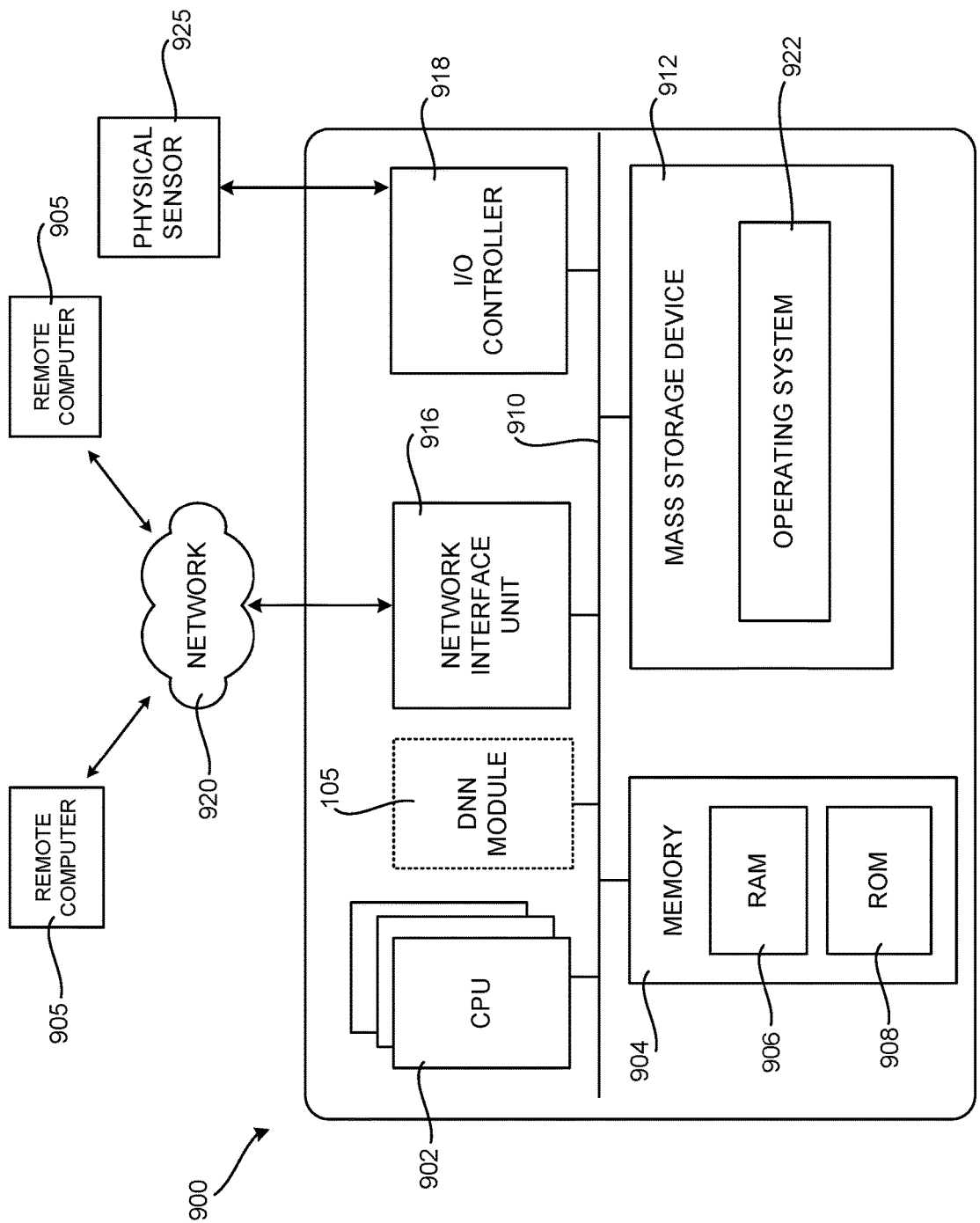
FIG. 9 is a computer architecture diagram showing an illustrative computer hardware and software architecture for a computing device that can act as an application host for the DNN module presented herein, according to one embodiment.

FIG. 9 is a computer architecture diagram showing an illustrative computer hardware and software architecture for a computing device that can act as an application host for the DNN module 105 presented herein. In particular, the architecture illustrated in FIG. 9 can be utilized to implement a server computer, mobile phone, an e-reader, a smartphone, a desktop computer, an AR/VR device, a tablet computer, a laptop computer, or another type of computing device suitable for use with the DNN module 105.

The computer 900 illustrated in FIG. 9 includes a central processing unit 902 ("CPU"), a system memory 904, including a random-access memory 906 ("RAM") and a read-only memory ("ROM") 908, and a system bus 910 that couples the memory 904 to the CPU 902. A basic input/output system ("BIOS" or "firmware") containing the basic routines that help to transfer information between elements within the computer 900, such as during startup, can be stored in the ROM 908. The computer 900 further includes a mass storage device 912 for storing an operating system 922, application programs, and other types of programs. The mass storage device 912 can also be configured to store other types of programs and data.

The mass storage device 912 is connected to the CPU 902 through a mass storage controller (not shown) connected to the bus 910. The mass storage device 912 and its associated computer readable media provide non-volatile storage for the computer 900. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 900.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 900. For purposes of the claims, the phrase "computer storage medium," and variations thereof, does not include waves or signals per se or communication media.

According to various configurations, the computer 900 can operate in a networked environment using logical connections to remote computers through a network such as the network 920. The computer 900 can connect to the network 920 through a network interface unit 916 connected to the bus 910. It should be appreciated that the network interface unit 916 can also be utilized to connect to other types of networks and remote computer systems. The computer 900 can also include an input/output controller 918 for receiving and processing input from a number of other devices, including a keyboard, mouse, touch input, an electronic stylus (not shown in FIG. 9), or a physical sensor such as a video camera. Similarly, the input/output controller 918 can provide output to a display screen or other type of output device (also not shown in FIG. 9).

It should be appreciated that the software components described herein, when loaded into the CPU 902 and executed, can transform the CPU 902 and the overall computer 900 from a general-purpose computing device into a special-purpose computing device customized to facilitate the functionality presented herein. The CPU 902 can be constructed from any number of transistors or other discrete circuit elements, which can individually or collectively assume any number of states. More specifically, the CPU 902 can operate as a finite-state machine, in response to executable instructions contained within the software modules disclosed herein. These computer-executable instructions can transform the CPU 902 by specifying how the CPU 902 transitions between states, thereby transforming the transistors or other discrete hardware elements constituting the CPU 902.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 900 in order to store and execute the software components presented herein. It also should be appreciated that the architecture shown in FIG. 9 for the computer 900, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 900 might not include all of the components shown in FIG. 9, can include other components that are not explicitly shown in FIG. 9, or can utilize an architecture completely different than that shown in FIG. 9.

Figure 10:
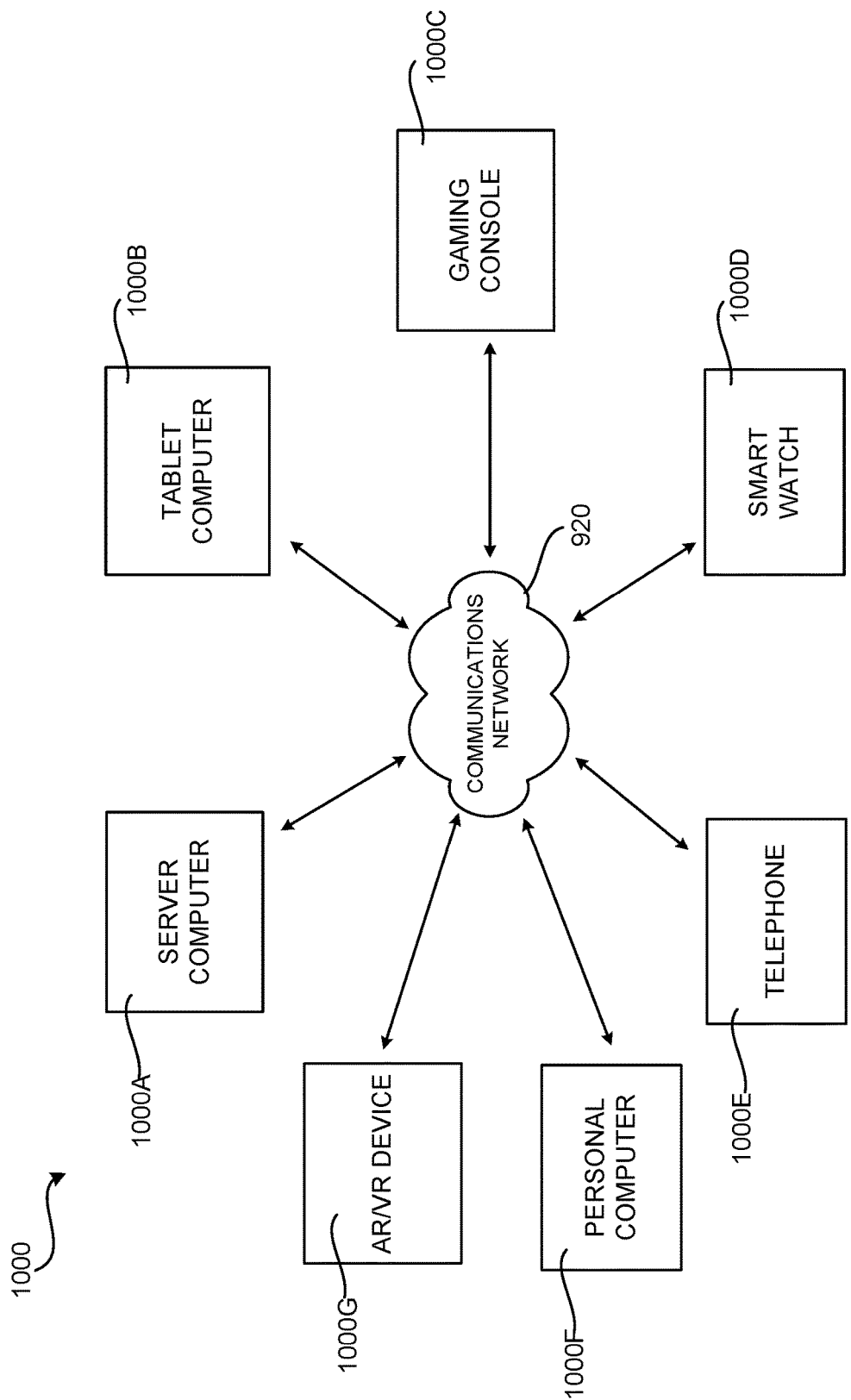
FIG. 10 is a network diagram illustrating a distributed computing environment in which aspects of the disclosed technologies can be implemented, according to various embodiments presented herein.

FIG. 10 is a network diagram illustrating a distributed network computing environment 1000 in which aspects of the disclosed technologies can be implemented, according to various embodiments presented herein. As shown in FIG. 10, one or more server computers 1000A can be interconnected via a communications network 920 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 1000B, a gaming console 1000C, a smart watch 1000D, a telephone 1000E, such as a smartphone, a personal computer 1000F, and an AR/VR device 1000G.

In a network environment in which the communications network 920 is the Internet, for example, the server computer 1000A can be a dedicated server computer operable to process and communicate data to and from the client computing devices 1000B-1000G via any of a number of known protocols, such as, hypertext transfer protocol ("HTTP"), file transfer protocol ("FTP"), or simple object access protocol ("SOAP"). Additionally, the networked computing environment 1000 can utilize various data security protocols such as secured socket layer ("SSL") or pretty good privacy ("PGP"). Each of the client computing devices 1000B-1000G can be equipped with an operating system operable to support one or more computing applications or terminal sessions such as a web browser (not shown in FIG. 10), or other graphical user interface (not shown in FIG. 10), or a mobile desktop environment (not shown in FIG. 10) to gain access to the server computer 1000A.

The server computer 1000A can be communicatively coupled to other computing environments (not shown in FIG. 10) and receive data regarding a participating user's interactions/resource network. In an illustrative operation, a user (not shown in FIG. 10) may interact with a computing application running on a client computing device 1000B-1000G to obtain desired data and/or perform other computing applications.

The data and/or computing applications may be stored on the server 1000A, or servers 1000A, and communicated to cooperating users through the client computing devices 1000B-1000G over an exemplary communications network 920. A participating user (not shown in FIG. 10) may request access to specific data and applications housed in whole or in part on the server computer 9800A. These data may be communicated between the client computing devices 1000B-1000G and the server computer 1000A for processing and storage.

The server computer 1000A can host computing applications, processes and applets for the generation, authentication, encryption, and communication of data and applications, and may cooperate with other server computing environments (not shown in FIG. 10), third party service providers (not shown in FIG. 10), network attached storage ("NAS") and storage area networks ("SAN") to realize application/data transactions.

It should be appreciated that the computing architecture shown in FIG. 9 and the distributed network computing environment shown in FIG. 10 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A neural network module, comprising: at least one neuron; a memory device storing a first buffer storing first data for processing by the at least one neuron in the neural network module; and wherein the neural network module is configured to: perform at least one first arithmetic operation by way of the at least one neuron using a first operand obtained from the first buffer and a second operand; and perform at least one second arithmetic operation by way of the at least one neuron using the first operand obtained from the first buffer and a third operand.

Clause 2. The neural network module of clause 1, wherein the first data comprises input data to a neural network, the second operand comprises first weight data associated with the neural network, and the third operand comprises second weight data associated with the neural network.

Clause 3. The neural network module of any of clauses 1 and 2, wherein the first data comprises weight data associated with a neural network, the second operand comprises first input data to the neural network, and the third operand comprises second input data to the neural network.

Clause 4. The neural network of module of any of clauses 1-3, further comprising a first accumulator, and wherein the first accumulator accumulates a result of the first arithmetic operation with a first previously stored result.

Clause 5. The neural network of module of any of clauses 1-4, further comprising a second accumulator, and wherein the second accumulator accumulates a result of the second arithmetic operation with a second previously stored result.

Clause 6. The neural network module of any of clauses 1-5, further configured to power-gate a bank of accumulators including the first accumulator and the second accumulator when all accumulators in the bank of accumulators are not in use by the at least one neuron and do not store partial sums needed by the at least one neuron.

Clause 7. The neural network module of any of clauses 1-6, further configured to clock-gate the bank of accumulators when all accumulators in the bank of accumulators are not in use and do not store partial sums needed by the at least one neuron.

Clause 8. A method for processing data in a neural network module, the method comprising: performing a first arithmetic operation by way of a neuron in the neural network module using a first operand from first data stored in a first buffer and a second operand from second data stored in a second buffer; loading third data into the second buffer; and performing a second arithmetic operation by way of the neuron in the neural network module using the first operand and a third operand from the third data stored in the second buffer.

Clause 9. The method of clause 8, wherein the first data comprises input data to a neural network, the second data comprises first weight data associated with the neural network, and the third data comprises second weight data associated with the neural network.

Clause 10. The method of any of clauses 8 and 9, wherein the first data comprises weight data associated with a neural network, the second data comprises first input data to the neural network, and the third data comprises second input data to the neural network.

Clause 11. The method of any of clauses 8-10, further comprising accumulating a result of the first arithmetic operation with first previously stored results in a first accumulator of the neural network module.

Clause 12. The method of any of clauses 8-11, further comprising accumulating a result of the second arithmetic operation with second previously stored results in a second accumulator of the neural network module.

Clause 13. The method of any of clauses 8-12, further comprising power-gating a bank of accumulators including the first accumulator and the second accumulator when all accumulators in the bank of accumulators are not in use and do not store a partial sum needed for a future operation.

Clause 14. The method of any of clauses 8-13, further comprising clock-gating the bank of accumulators when all accumulators in the bank of accumulators are not in use and do not store a partial sum needed for a future operation.

Clause 15. A neural network module, comprising: a first memory device storing a plurality of banks of accumulators; and a plurality of neurons configured to write output values to the accumulators, and wherein the neural network module is configured to clock-gate a first bank of the plurality of banks of accumulators if all the accumulators in the first bank of accumulators are not in use by any of the plurality of neurons, but one or more of the accumulators in the first bank of accumulators stores partial results.

Clause 16. The neural network module of clause 15, wherein the neural network module is further configured to power-gate a second bank of the plurality of banks of accumulators if all the accumulators in the second bank of accumulators do not store partial results and are not in use by any of the plurality of neurons.

Clause 17. The neural network module of any of clauses 15 and 16, wherein a first neuron of the plurality of neurons is configured to write first output values to the first accumulator to accumulate the first output values with first previously stored output values.

Clause 18. The neural network module of any of clauses 15-17, wherein the first neuron of the plurality of neurons is configured to write second output values to the second accumulator to accumulate the second previously stored output values.

Clause 19. The neural network module of any of clauses 15-18, wherein the neural network module further comprises a second memory device storing a first buffer and a second buffer, and wherein the neural network module is further configured to: load first data to the first buffer; cause a first arithmetic operation to be performed by a neuron of the plurality of neurons using a first operand from first data stored in the first buffer and a second operand from second data stored in the second buffer; load third data to the second buffer; and cause a second arithmetic operation to be performed by way of the neuron of the plurality of neurons using the first operand and a third operand from the third data stored in the second buffer.

Clause 20. The neural network module of any of clauses 15-19, wherein: the first data comprises input data, the second data comprises weight data, and the third data comprise weight data; or the first data comprises weight data, the second data, comprises input data, and the third data comprises input data.

Based on the foregoing, it should be appreciated that a power-efficient DNN module that can utilize parallel kernel processing, parallel input processing, accumulator bank gating, or other power saving techniques has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A neural network module, comprising:
   at least one neuron;
   a first accumulator;
   a second accumulator; and
   a memory device storing a first buffer storing first data for processing by the at least one neuron in the neural network module; and
   wherein the neural network module is configured to:

perform at least one first arithmetic operation by way of the at least one neuron using a first operand obtained from the first buffer and a second operand to generate a result, wherein the first accumulator accumulates the result of the first arithmetic operation with a first previously stored result; and perform at least one second arithmetic operation by way of the at least one neuron using the first operand obtained from the first buffer and a third operand to generate a result, wherein the second accumulator accumulates the result of the second arithmetic operation with a second previously stored result.

2. The neural network module of claim 1, wherein the first data comprises input data to a neural network, the second operand comprises first weight data associated with the neural network, and the third operand comprises second weight data associated with the neural network.

3. The neural network module of claim 1, wherein the first data comprises weight data associated with a neural network, the second operand comprises first input data to the neural network, and the third operand comprises second input data to the neural network.

4. The neural network module of claim 1, further configured to power-gate a bank of accumulators including the first accumulator and the second accumulator when all accumulators in the bank of accumulators are not in use by the at least one neuron and do not store partial sums needed by the at least one neuron.

5. The neural network module of claim 4, further configured to clock-gate the bank of accumulators when all accumulators in the bank of accumulators are not in use and do not store partial sums needed by the at least one neuron.

6. A method for processing data in a neural network module, the method comprising:

performing a first arithmetic operation by way of a neuron in the neural network module using a first operand from first data stored in a first buffer and a second operand from second data stored in a second buffer;

accumulating a result of the first arithmetic operation with first previously stored results in a first accumulator of the neural network module;

loading third data into the second buffer;

performing a second arithmetic operation by way of the neuron in the neural network module using the first operand and a third operand from the third data stored in the second buffer; and accumulating a result of the second arithmetic operation with second previously stored results in a second accumulator of the neural network module.

7. The method of claim 6, wherein the first data comprises input data to a neural network, the second data comprises first weight data associated with the neural network, and the third data comprises second weight data associated with the neural network.

8. The method of claim 6, wherein the first data comprises weight data associated with a neural network, the second data comprises first input data to the neural network, and the third data comprises second input data to the neural network.

9. The method of claim 6, further comprising power-gating a bank of accumulators including the first accumulator and the second accumulator when all accumulators in the bank of accumulators are not in use and do not store a partial sum needed for a future operation.

10. The method of claim 9, further comprising clock-gating the bank of accumulators when all accumulators in the bank of accumulators are not in use and do not store a partial sum needed for a future operation.

* * * * *